United States Patent
Cheng et al.

(10) Patent No.: US 10,756,170 B2
(45) Date of Patent: Aug. 25, 2020

(54) VFET DEVICES WITH IMPROVED PERFORMANCE

(71) Applicant: International Business Machines Corporation, Armonk, NY (US)

(72) Inventors: Kangguo Cheng, Schenectady, NY (US); Juntao Li, Cohoes, NY (US); Choonghyun Lee, Rensselaer, NY (US); Shogo Mochizuki, Clifton Park, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 108 days.

(21) Appl. No.: 15/954,663

(22) Filed: Apr. 17, 2018

(65) Prior Publication Data
US 2019/0319094 A1   Oct. 17, 2019

(51) Int. Cl.
*H01L 21/8234* (2006.01)
*H01L 29/06* (2006.01)
*H01L 29/08* (2006.01)
*H01L 29/66* (2006.01)
*H01L 21/02* (2006.01)

(52) U.S. Cl.
CPC ...... *H01L 29/0653* (2013.01); *H01L 29/0847* (2013.01); *H01L 29/66545* (2013.01); *H01L 29/66553* (2013.01); *H01L 29/66666* (2013.01); *H01L 21/02164* (2013.01); *H01L 21/02236* (2013.01); *H01L 21/02252* (2013.01)

(58) Field of Classification Search
CPC ............. H01L 21/823487; H01L 29/66666
See application file for complete search history.

(56) References Cited

U.S. PATENT DOCUMENTS

| | | |
|---|---|---|
| 9,773,708 B1 | 9/2017 | Zhang et al. |
| 9,780,088 B1 | 10/2017 | Balakrishnan et al. |
| 9,853,127 B1* | 12/2017 | Anderson ......... H01L 29/66666 |
| 9,859,420 B1 | 1/2018 | Balakrishnan et al. |
| 9,865,730 B1 | 1/2018 | Jagannathan et al. |
| 2018/0006118 A1 | 1/2018 | Mallela et al. |
| 2018/0012993 A1 | 1/2018 | Cheng et al. |

* cited by examiner

*Primary Examiner* — Mark V Prenty
(74) *Attorney, Agent, or Firm* — Cantor Colburn LLP; Vazken Alexanian

(57) ABSTRACT

Vertical field effect transistor (VFET) structures and methods of fabrication with improved junction sharpness and reduced parasitic capacitance between the top source or drain and the surrounding metal gate includes a non-uniform top spacer in the top source or drain formed by an oxidation process. The top spacer has a thickness that is thinner at an interface between the top source or drain region and the vertically oriented channel region of the fin structure relative to the thickness of the top spacer layer away from the interface.

19 Claims, 3 Drawing Sheets

VFET DEVICES WITH IMPROVED PERFORMANCE

BACKGROUND

The present invention relates in general to semiconductor device fabrication methods and resulting structures. More specifically, the present invention relates to fabrication methods and resulting semiconductor device structures including a vertical transport field effect transistor.

In contemporary semiconductor device fabrication processes, a large number of semiconductor devices, such as field effect transistors (FETs), are fabricated on a single wafer. Some non-planar transistor device architectures, such as vertical field effect transistors (VFETs), employ semiconductor fins and side-gates that can be contacted outside the active region, resulting in increased device density and performance over lateral devices. VFETs are one of the promising alternatives to standard lateral FET structures due to benefits, among others, in terms of reduced circuit footprint. In this type of structure, the current flow is perpendicular to a supporting wafer, unlike the lateral current flow in fin-type FETs (FinFETs).

SUMMARY

According to one or more embodiments of the present invention, a VFET structure and a method for forming a VFET structure are provided. A non-limiting example of the method for forming a VFET structure includes forming a top sacrificial spacer in a recessed dummy gate such that the top sacrificial spacer is adjacent to a fin and coplanar to a top surface of the fin. A top source or drain is epitaxially grown onto the top surface of the fin such that a gap is formed between the top source or drain and the top sacrificial spacer. A surface of the top source or drain is oxidized to form an oxide spacer layer thereon, wherein the oxide spacer layer has a thickness that is thinner at an interface between the top source or drain region and the vertically oriented channel region of the fin structure relative to the thickness of the top spacer layer away from the interface.

A non-limiting example of the method of forming a VFET structure includes providing an intermediate structure including a substrate, a bottom source or drain layer on the substrate; a fin extending vertically from and in contact with the bottom source or drain layer, wherein the fin includes a hardmask thereon, a bottom spacer on the bottom source or drain layer adjacent the fin, a recessed dummy gate about the fin, a nitride top spacer layer filling the recessed dummy gate, wherein the nitride top spacer layer has a surface coplanar to the top surface of the fin, and an interlayer dielectric coplanar with a top surface of the hardmask. The hardmask and the interlayer dielectric is selectively removed to expose a top surface of the fin. A top source or drain is epitaxially grown on the top surface of the fin such that a gap is formed between the top source or drain and the top sacrificial spacer. A surface of the top source is oxidized to form a top oxide spacer layer therein, wherein the top oxide spacer layer has a thickness that is thinner at an interface between the top source or drain region and the top surface of the fin structure relative to the thickness of the top oxide spacer layer away from the interface.

A non-limiting example of the VFET structure includes a top source or drain region extending from a vertically oriented channel region of a fin structure; and a top oxide spacer layer about the top source or drain region. The top oxide spacer has a thickness that is thinner at an interface between the top source or drain region and the vertically oriented channel region of the fin structure relative to the thickness of the top spacer layer away from the interface.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
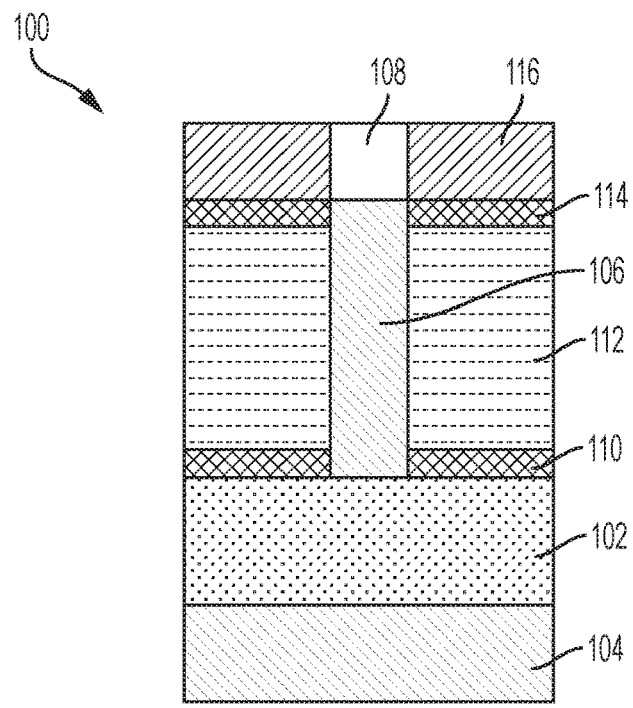
FIG. 1 depicts a cross-sectional view of a VFET structure up to formation of a top source or drain region according to one or more embodiments of the present invention.

The present invention is generally directed to VFET structures and methods to form the VFET structures with improved junction sharpness and reduced parasitic capacitance between the top source/drain and metal gate. The method and structure generally includes a non-uniform top spacer on the top source/drain that has different dimensions in the vertical direction. For example, the non-uniform top spacer can include a relatively thinner top spacer formed adjacent the channel region of a fin and a relatively thicker spacer formed away from the channel between the top source/drain and the gate, i.e., e.g., gradually increases in thickness from the fin channel to the distal portion of the top source/drain. As will be described in greater detail below, the non-uniform top spacer can be formed by first forming a top nitride spacer over a recessed dummy gate such that the top nitride spacer is adjacent to the FET fin and coplanar with the top of the fin. A top source/drain is epitaxially grown on the fin and a low temperature oxidation process is then utilized to form the non-uniform top spacer as described above, which is due to the presence of the top nitride spacer. The top nitride spacer and dummy gate are then removed and replaced with a high-k metal gate structure, wherein the gate is farther away from the top source/drawn because of the relatively thicker portion of the top spacer about the top source/drain resulting in reduced parasitic capacitance therebetween.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising", "includes", "including", "has," "having", "contains" or "containing", or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment", "an example embodiment", etc., indicate that the embodiment described can include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right", "left", "vertical", "horizontal", "top", "bottom", and derivatives thereof shall relate to the described structures and methods, as oriented in the drawing figures. The terms "overlying", "atop", "on top", "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to", such as, for example, "a first element selective to a second element", means that a first element can be etched and the second element can act as an etch stop.

For the sake of brevity, conventional techniques related to semiconductor device and integrated circuit (IC) fabrication are not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device utilizing a non-selective low temperature deposition process for forming the top source/drain in a VFET device followed by a low temperature oxidation process to form the non-uniform top spacer according to the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

Turning now to a more detailed description of technologies relevant to the present invention, as previously noted herein, some non-planar transistor device architectures, such as vertical field effect transistors, employ semiconductor fins and side-gates that can be contacted outside the active region, resulting in increased device density and performance over lateral devices.

Methods including a non-selective low temperature oxidation process to form a non-uniform top spacer on a multifaceted top source/drain of a VFET structure and the resulting structures therefrom in accordance with embodiments of the present invention are described in detail below by referring to the accompanying drawings in FIGS. 1-6. In addition to the low temperature oxidation process, the methods and structures include forming a metal gate including an angled surface.

FIG. 1 illustrates a cross-sectional view representative of a VFET structure 100 up to formation of a top source or drain module (hereinafter referred to as "source/drain"). It should be apparent that the present invention is not limited to this particular structure nor is it intended to be limited to any particular method for forming the VFET up to formation of the top source/drain module. One of ordinary skill in the art will recognize that the VFET structure immediately prior to the top source/drain module can include a planar surface, or alternatively, can include topography.

The VFET structure 100 up to formation of a top source/drain module generally includes the following components as shown in FIG. 1. First, the structure 100 includes a bottom epitaxy region 102 formed on a substrate 104, wherein the bottom region 102 is doped to define a bottom source/drain region. The doping of the bottom epitaxy region 102 can be configured as the bottom source/drain formed in the substrate 104 by a variety of methods, such as, for example, diffusion and/or ion implantation, in-situ doped epitaxy, or any other suitable doping techniques.

The substrate 104 can be any suitable substrate material, such as, for example, any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as substrate 104. In one or more embodiments and when substrate 104 is a remaining semiconductor material portion of a bulk semiconductor substrate, the substrate 104 can be of a single crystalline semiconductor material, such as, for example, single crystalline silicon. In some embodiments, the crystal orientation of the remaining semiconductor portion of the bulk semiconductor substrate can be {100}, {110}, {111} or any other of the well-known crystallographic orientations. As will be described in greater detail below, each semiconductor fin can include the same semiconductor material, or a different semiconductor material, from substrate 104.

In another embodiment, substrate 104 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate is a non-semiconductor material including, for example, a dielectric material and/or a conductive material. In yet other embodiments, the handle substrate can be omitted and the substrate 104 includes only an insulator layer.

In one or more embodiments, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate and that can be employed as substrate 104 can be a crystalline or non-crystalline oxide and/or nitride. In one embodiment, the insulator layer is an oxide such as, for example, silicon dioxide. In another embodiment, the insulator layer is a nitride such as, for example, silicon nitride or boron nitride. In yet another embodiment, the insulator layer is a multi-layered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from 10 nm to 100 nm. Other thicknesses that are lesser than, or greater than, the aforementioned thickness range can also be used as the thickness of the semiconductor layer of the SOI substrate. The insulator layer of the SOI substrate can have a thickness from 1 nm to 200 nm. Other thicknesses that are lesser than, or greater than, the aforementioned thickness range can also be employed as the insulator layer.

The first exemplary semiconductor structure shown in FIG. 1 can be formed by first providing a bulk semiconductor substrate (as defined above) or a SOI substrate (as defined above). Adjacent devices formed on the substrate can be separated by shallow trench isolation regions (not shown). The shallow trench isolation regions can be created early during the semiconductor device fabrication process, e.g., before the transistors such as the illustrated VFET are formed. The key steps for forming the shallow trench isolation regions typically involve etching a pattern of trenches in the substrate 104, depositing one or more dielectric materials (such as silicon dioxide) to fill the trenches, and removing the excess dielectric using a technique such as chemical-mechanical planarization.

The bottom epitaxy layer 102 can be formed by epitaxial growth and/or deposition. As used herein, the terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In one or more embodiments, the gas source for the deposition of epitaxial semiconductor material can include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. The particular epitaxial region is not intended to be limited and will generally depend on the type of VFET being formed.

The epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 500° C. to 900° C.

A vertically oriented semiconductor fin 106 is formed on and coupled to the bottom epitaxy layer 102. Any known composition and manner of forming the semiconductor fin 106 can be utilized. In one or more embodiments, an undoped channel region is epitaxially deposited over the bottom epitaxy layer 102 and is etched using a patterned hard mask 108 to form a plurality of fins, as described below. The fins 106, one of which is shown, extends vertically from the substrate 104. Stated differently, the fin 106 is normal to or perpendicular to the substrate 104 including a portion having a shape of a rectangular parallelepiped.

The etching to form the fins 106 can include a dry etching process such as, for example, reactive ion etching, plasma etching, ion etching, or laser ablation. The etching can further include a wet chemical etching process in which one or more chemical etchants are used to remove portions of the blanket layers that are not protected by the patterned hardmask 108.

The direction along which a semiconductor fin 106 laterally extends the most is herein referred to as a "lengthwise direction" of the fin. The height of each semiconductor fin 106 can be in a range from about 5 nm to about 300 nm, although lesser and greater heights can also be employed. The width of each semiconductor fin 106 can be in a range from about 5 nm to about 100 nm, although lesser and greater widths can also be employed. In various embodiments, the fins 106 can have a width in the range of about 4 nm to about 20 nm, or can have a width in the range of about 5 nm to about 15 nm, or in the range of about 6 nm to about 8 nm. In various embodiments, the fin 106 can have a height in the range of about 25 nm to about 75 nm, or in the range of about 40 nm to about 50 nm. Alternatively, the bottom source/drain can be formed after the formation of fins.

Multiple fins 106 can be arranged such that the multiple fins 106 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each fin 106 includes a pair of parallel sidewalls along the lengthwise direction.

The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials.

The hardmask 108 can include, for example, a silicon nitride (SiN) hardmask. The hardmask 108 can be deposited using a deposition process, including, but not limited to, PVD, CVD, PECVD, or any combination thereof. Other hard mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The hardmask can have a single material or multiple materials.

A bottom spacer layer 110 can be directionally deposited onto the bottom epitaxy layer 102 between the vertically oriented fin structures. The bottom spacer layer can be deposited by any non-conformal deposition methods that provides a faster deposition rate on the planar surface and slower deposition rate on the sidewall surface including but not limited to plasma vapor deposition (PVD), high density plasma (HDP) deposition or the like. After directional deposition of bottom spacer, an etch-back process is performed to remove the any residue of spacer materials from the fin sidewall. In PVD, a pure source material is gasified via evaporation, the application of high power electricity, laser ablation, or the like. The gasified material will then condense on the substrate material to create the desired layer. In one or more embodiments, the bottom spacer 110 can be a low k dielectric material. The term "low k dielectric" generally refers to an insulating material having a dielectric constant less than silicon nitride, i.e., less than 7.0. Exemplary low k dielectric materials include, but are not limited to, dielectric nitrides (e.g., silicon nitride, SiBCN), dielectric oxynitrides (e.g., SiOCN), or any combination thereof or the like.

In some exemplary embodiments, the bottom spacer layer 110 can include a material that is resistant to some etching processes such as, for example, HF chemical etching or chemical oxide removal etching. In one or more embodiments, the spacer 20 can have a thickness in the range of about 3 nm to about 10 nm, or in the range of about 4 nm to about 6 nm.

A dummy gate 112 is formed adjacent to the fins 106 on the bottom spacer layer 110 and over the shallow trench isolation regions (not shown). The dummy gate material 112 can be, for example, amorphous silicon layer or polysilicon. The dummy gate material can be formed by deposition of the desired silicon material, planarization using a suitable process such as, for example, chemical mechanical polishing (CMP), gate lithography, and reactive ion etching (RIE) to define the dummy gate. The dummy gate is then recessed to expose an upper portion of the fin 106. Dummy gate can have a single material (e.g. amorphous carbon) or multiple materials (e.g., a dummy oxide liner between dummy amorphous silicon gate and fins).

A sacrificial top spacer layer 114 is deposited in the recess of the dummy gate 112. In one or more embodiments, the sacrificial top spacer layer can be a conformal nitride liner, e.g., SiN, of the interlayer dielectric 116, which is deposited thereon as shown. In this manner, the nitride liner covers sidewalls of the exposed top portion of the fin 106, as well as sidewalls/top surface (not shown) of the hard mask 108. The conformal SiN liner can also cover the exposed portions/sections of the interlayer dielectric (not shown).

A chemical-mechanical planarization selective to the hard mask 108 can be used to remove any excess portion of the interlevel dielectric (ILD) known as overburden). Any known composition and manner of forming the ILD 116 can be utilized. By way of example, the ILD can include any dielectric material including inorganic dielectrics or organic dielectrics. Some examples of suitable dielectrics that can be used as the dielectric material include, but are not limited to: silicon oxide, silsequioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD can be deposited by spin on processes, PECVD processes or the like as is generally known in the art.

Figure 2:
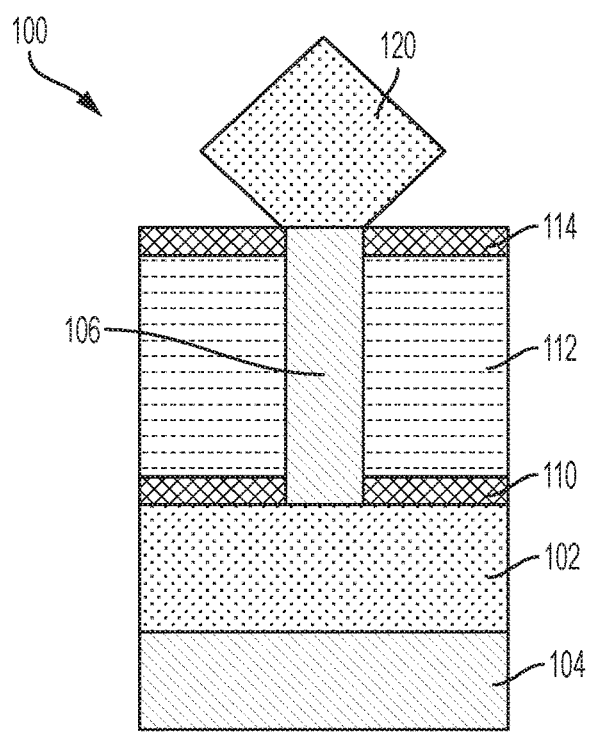
FIG. 2 depicts the cross-sectional view of the VFET structure after formation of a doped source/drain layer on the VFET structure of FIG. 1, wherein a multifaceted doped single crystalline silicon is formed on a channel region surface according to one or more embodiments of the present invention.

FIG. 2 is a cross-sectional view of the semiconductor device of FIG. 1, where the hardmask 108 and interlayer dielectric 116 positioned over the fins 106 is etched away to the top nitride spacer layer 114, by either wet or dry etch processes in accordance with an embodiment of the present invention.

In various embodiments, etching takes place to remove the hard mask 108, as well portions/sections as the SiN mask 114, if present, contacting or engaging the hard mark 108. The removal of the hard mask 108 allows for the exposure of the top surface of the fin 106.

In one or more embodiments, a multi-faceted top source/drain 120 is epitaxially grown in the VFET structure. The multi-faceted top source/drain can be epitaxially grown onto the exposed portion of the fin 106 using a low temperature deposition process. In various embodiments, the top source/drain 120 can be n-doped or p-doped. It should be noted that the source and drain can be interchangeable between the top and bottom locations of the vertical fin 106, where the doped region in the substrate can act as a source or a drain.

The epitaxial semiconductor material that provides the source/drain regions 102 or 120 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses. For nFET devices, Si:P (phosphorus-doped silicon) can be used as the doping layer whereas for pFET devices, SiGe:B (boron-doped silicon germanium) can be used as the doping layer.

Epitaxial materials can be grown from gaseous or liquid precursors. Epitaxial materials can be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. Epitaxial silicon, silicon germanium (SiGe), germanium (Ge), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1 \times 10^{19}$ cm$^{-3}$ to about $3 \times 10^{21}$ cm$^{-3}$, or in one or more other embodiments, can be in a range from about $2 \times 10^{20}$ cm$^{-3}$ and about $3 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The Si:C layer can be grown in the same chamber used for other epitaxy steps or in a dedicated Si:C epitaxy chamber. Greater carbon content or a thicker Si:C layer can slow phosphorus diffusion without greatly affecting the rate of boron diffusion, so the carbon content and thickness can be tailored as needed. The Si:C layer can be in the range of 1 nm to 10 nm thick and can include carbon in the range of 0.2 to 3.0%. In one or more embodiments, the Si:C layer can be quite thin such as in the range of less than 5 nm, or between 1 and 5 nm thick, e.g., 3 nm thick, and can have between 2 and 2.5% carbon. The Si:C layer can be formed by traditional epitaxial processing, or a cyclical process.

One such cyclical process includes a first epitaxial deposition. On exposed semiconductor surfaces, the growth will be single crystalline. Elsewhere, the growth will be amorphous. An etch using only an etchant gas such as chlorine or HCl or Cl2 can be used to attack and remove the amorphous material. This etch can be timed to leave some crystalline material while removing all the amorphous material. Repeating this sequence can build up a desired thickness of crystalline material.

According to one or more embodiments, after a sufficient thickness of Si:C is formed, the conditions in the chamber can be adjusted to fill the pFET source drain with material such as boron doped silicon germanium that promotes hole mobility, and simultaneously fill the nFET source drain with the same material. For example if the fin material is silicon, a preferred pFET source drain material can be silicon germanium having germanium content in the range of 5% to 80%, or preferably between 20% and 60%. The optimal germanium content of the SiGe source drain can be selected based on design preferences and in embodiments can be about 40%. In preferred embodiments the source drain filling step 114 can utilize epitaxial growth conditions that promote in-situ boron doped formation of SiGe to merge the source drain regions in both the nFET and pFET regions. The conditions can be tuned to incorporate in the SiGe a boron content in the range of about $1 \times 10^{19}$ cm$^{-3}$ to about $2 \times 10^{21}$ cm$^{-3}$, or in one or more other embodiments, can be in a range from about $2 \times 10^{20}$ cm$^{-3}$ and about $7 \times 10^{20}$ cm$^{-3}$.

By way of example, a phosphorous doped silicon layer can utilize silicon containing precursors such as $SiH_4$, $Si_2H_6$, $Si_3H_8$, $Si_4H_{10}$ and the like for silicon growth. For phosphorous doping, $PH_3$ can be used as the gas source. The low temperature deposition is generally non-selective and can be used to form a phosphorous doped semi-crystalline (i.e., polysilicon) and/or a phosphorous doped non-crystalline amorphous silicon (referred to herein as "poly/amorphous silicon") on the dielectric surfaces, e.g., 114, and a phosphorous doped single crystalline silicon on the exposed surfaces of the channel region of the fin structure 106. Because of the growth rate difference in different crystal orientations, a multifaceted top source/drain region of the single crystalline silicon on the channel 106 is formed, which is depicted as diamond shaped. The poly/amorphous silicon can be selectively removed from the substrate using an etching process.

Figure 3:
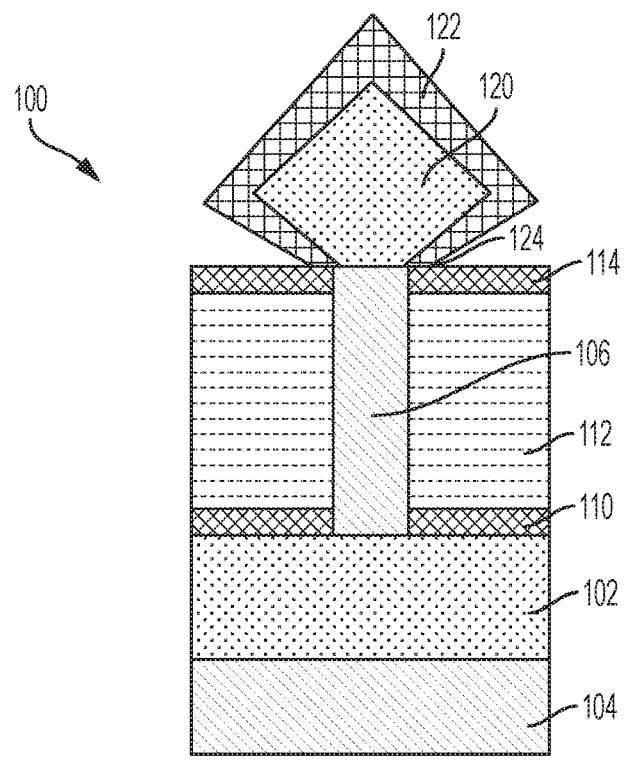
FIG. 3 depicts the cross-sectional view of the VFET structure of FIG. 2 subsequent to deposition of a non-uniform spacer material on the multifaceted doped single crystalline silicon according to one or more embodiments of the present invention.

In FIG. 3, an oxidation process, e.g., a wet oxidation or plasma oxidation, is used for form an oxide spacer 122 about the top source/drain 120. Due to presence of the nitride top spacer 114, the oxide layer that is formed on the diamond shaped source/drain 120 is thinner at the interface 124 between the top source/drain 120 and nitride top spacer 114 but gradually thickens as the oxide layer is deposited away from the corner 124. In one or more embodiments, the oxidation process is a low temperature oxidation process with process temperature below 700° C. In some embodiments, the nitride top spacer protects other device structures such as fins, dummy gate, from undesired oxidation.

The low temperature oxidation process can convert the surface of the source drain 120 into an oxide. The low temperature oxidation process can be performed at a temperature of about 700° C., or less. More typically, the low temperature oxidation process is performed within a range of about 400° C. to about 700° C. The low temperature oxidation process can be performed utilizing any oxidation process that is capable of operation at the above temperature range. For example, the oxidation can include, in one preferred low temperature oxidation process is a high pressure oxidation (HIPDX) process.

Figure 4:
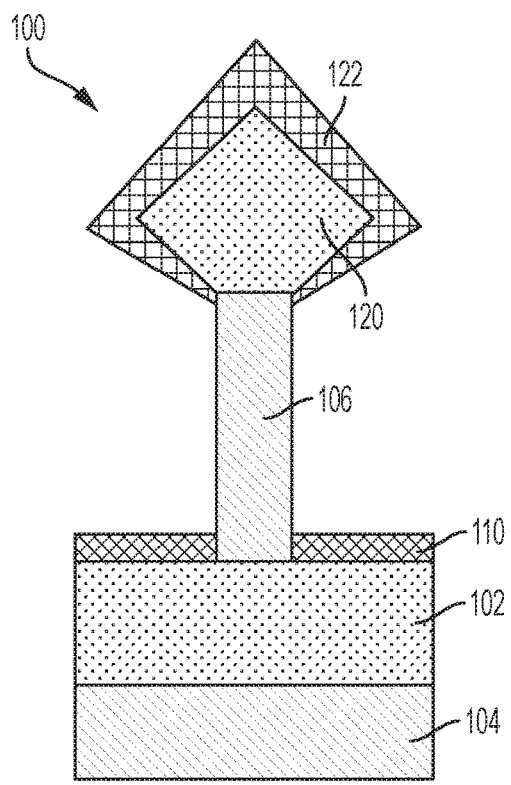
FIG. 4 depicts the cross-sectional view of the VFET structure of FIG. 3 subsequent to top spacer and dummy gate removal according to one or more embodiments of the present invention.

In FIG. 4, the top nitride spacer layer and the recessed dummy gate are removed according to a replacement metal gate (RMG) process as understood by those ordinarily skilled in the art. For example, the top nitride spacer layer 114 and the dummy gate 112 can be removed using an RIE process and/or a wet etching process. According to at least one embodiment, an anneal process can be performed after removing the dummy gate to activate the dopants of the source/drain regions. The anneal process can generate a temperature of approximately 900 degrees Celsius (C) or higher, for example. Alternatively, the dopant activation anneal can be done at any other suitable process steps such as after epitaxy, after ILD deposition after dummy gate removal, after high-k gate dielectric deposition, etc. The anneal can be a rapid thermal anneal (RTA), laser anneal, flash anneal, or any suitable combination of those processes.

Figure 5:
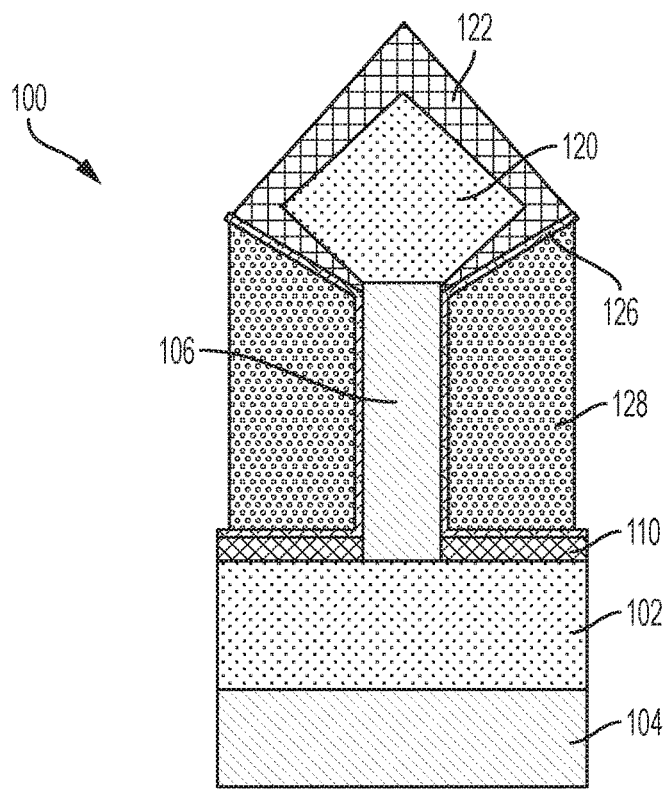
FIG. 5 depicts the cross-sectional view of the VFET structure of FIG. 4 subsequent to a replacement high-k metal gate process according to one or more embodiments of the present invention.

Referring to FIG. 5, a high-dielectric constant (high-k) layer is deposited as a gate dielectric 126 and followed by the formation of metal gate 128. Gate dielectric can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1nm to 5*nm*, although less thickness and greater thickness are also conceived.

Gate conductor can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a work function setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Figure 6:
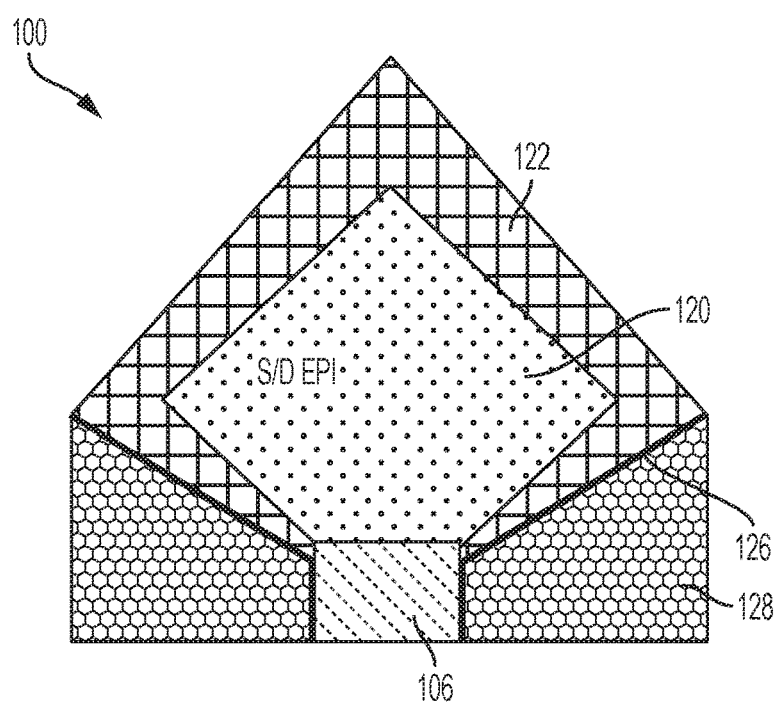
FIG. 6 depicts an enlarged cross-sectional view of the top source or drain of the VFET structure of FIG. 5 according to one or more embodiments of the present invention.

As shown more clearly in FIG. 6, the top oxide pacer 122 is relatively thinner at the interface 124 between the source/drain 120 and the fin 106, which sharpens the junction therebetween. Moreover, the thickness of the top oxide spacer 122 increases away from the interface 124, which reduces the parasitic capacitance between the metal gate 128 and the source/drain 120 because the distance increases between the metal gate and the source/drain. As shown, the gate dielectric 126 and the gate metal 128 have an angled top surface. Compared with the case where the metal gate has a flat top surface, the metal gate has more volume (larger cross-sectional area in FIG. 6). The more volume in the metal gate, the lower resistance of the metal gate. Lower gate resistance is also beneficial to device performance.

In one or more embodiments, a dielectric material is then deposited onto the VFET structure and trenches can be etched vertically down through the dielectric material to the top source/drain 120 to form metal contacts to the vertical finFET as well as form metal contacts for back end of line (BEOL) electrical connections to the gate structure(s). The metal contact fill can be tungsten (W), aluminum (Al), or copper (Cu), cobalt (Co), which can further include a barrier layer. The barrier layer can be titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with the top source drain material, and/or anode/cathode material. In various embodiments, the barrier layer can be conformally deposited in the trench(es) by ALD, CVD, MOCVD, PECVD, or combinations thereof. In various embodiments, the metal fill can be formed by ALD, CVD, and/or PVD to form the electrical contacts.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a VFET structure, the method comprising:
    forming a top sacrificial spacer in a recessed dummy gate such that the top sacrificial spacer is adjacent to a fin and coplanar to a top surface of the fin;
    epitaxially growing a top source or drain onto the top surface of the fin such that a gap is formed between the top source or drain and the top sacrificial spacer; and
    oxidizing a surface of the top source or drain to form an oxide spacer layer thereon, wherein the oxide spacer layer has a thickness that is thinner at an interface between the top source or drain region and the vertically oriented channel region of the fin structure relative to the thickness of the top spacer layer away from the interface.

2. The method of claim 1, wherein depositing the oxide spacer layer comprises a low temperature oxidation process at temperatures less than 700° C.

3. The method of claim 2, wherein the low temperature oxidation process comprises a plasma oxidation process or a wet oxidation process.

4. The method of claim 1, wherein the top source or drain comprises a diamond shape.

5. The method of claim 1, wherein the top sacrificial spacer layer comprises a nitride.

6. The method of claim 1, further comprising replacing the top sacrificial spacer and the recessed dummy gate with a high-k dielectric and metal gate structure.

7. The method of claim 1, wherein the top sacrificial spacer layer comprises a conformal nitride liner of the interlayer dielectric.

8. The method of claim 1, wherein the recessed dummy gate comprises amorphous silicon or polysilicon.

9. A method of forming a VFET structure, the method comprising:
    providing an intermediate structure comprising:
        a substrate, a bottom source or drain layer on the substrate;
        a fin extending vertically from and in contact with the bottom source or drain layer, wherein the fin includes a hardmask thereon;
        a bottom spacer on the bottom source or drain layer adjacent the fin;
        a recessed dummy gate about the fin;
        a top nitride spacer layer filling the recessed dummy gate, wherein the nitride top spacer layer has a surface coplanar to the top surface of the fin; and an interlayer dielectric coplanar with a top surface of the hardmask;

selectively removing the hardmask and the interlayer dielectric to expose a top surface of the fin;

epitaxially growing a top source or drain on the top surface of the fin such that a gap is formed between the top source or drain and the top nitride spacer;

oxidizing a surface of the top source or drain to form a top oxide spacer layer therein, wherein the top oxide spacer layer has a thickness that is thinner at an interface between the top source or drain region and the top surface of the fin structure relative to the thickness of the top oxide spacer layer away from the interface.

10. The method of claim 9, wherein the thickness of the top oxide spacer layer gradually increases from the interface along a surface of the top source or drain region.

11. The method of claim 9, wherein the high-k dielectric and metal gate structure includes an angled upper surface complementary to and in contact with a portion of the top source or drain.

12. The method of claim 9, wherein the top nitride spacer layer comprises a conformal nitride liner of the interlayer dielectric.

13. The method of claim 9, wherein the bottom source or drain and the top source or drains comprise p-type dopants.

14. The method of claim 9, wherein the bottom source or drain and the top source or drains comprise n-type dopants.

15. The method of claim 9, further comprising replacing the top nitride spacer layer and the recessed dummy gate; and forming a high-k dielectric and metal gate structure about the fin by a replacement metal gate process.

16. The method of claim 9, wherein depositing the oxide spacer layer comprises a low temperature oxidation process at temperatures less than about 700° C.

17. The method of claim 9, wherein the top source or drain comprises a diamond-shape.

18. A vertical field effect transistor (VFET) structure comprising:

a top source or drain region extending from a vertically oriented channel region of a fin structure; and a top oxide spacer layer about the top source or drain region, the top oxide spacer having a thickness that is thinner at an interface between the top source or drain region and the vertically oriented channel region of the fin structure relative to the thickness of the top spacer layer away from the interface;

a high-k dielectric and metal gate structure having an angled surface at an interface between the top spacer layer and the high-k metal gate structure.

19. The VFET structure of claim 18, wherein the thickness of the top spacer layer gradually increases away from the interface between the top source or drain region and the vertically oriented channel region of the fin structure.

* * * * *